United States Patent [19]

Hieber et al.

[11] Patent Number: 4,673,968
[45] Date of Patent: Jun. 16, 1987

[54] INTEGRATED MOS TRANSISTORS HAVING A GATE METALLIZATION COMPOSED OF TANTALUM OR NIOBIUM OR THEIR SILICIDES

[75] Inventors: Konrad Hieber, Bernau; Franz Neppl, Munich, both of Fed. Rep. of Germany

[73] Assignee: Siemens Aktiengesellschaft, Berlin and Munich, Fed. Rep. of Germany

[21] Appl. No.: 866,951

[22] Filed: May 27, 1986

[30] Foreign Application Priority Data

Jul. 2, 1985 [DE] Fed. Rep. of Germany ....... 3523648

[51] Int. Cl.$^4$ ................. H01L 23/48; H01L 29/78
[52] U.S. Cl. ................... 357/71; 357/23.1; 357/23.15; 427/93; 427/126.3
[58] Field of Search ............ 357/23.1, 23.15, 715; 427/93, 126.3

[56] References Cited

U.S. PATENT DOCUMENTS

| | | | |
|---|---|---|---|
| 4,238,439 | 8/1981 | Higashinakagawa | 427/89 |
| 4,282,647 | 8/1981 | Richman | 29/571 |
| 4,285,761 | 8/1981 | Fatula et al. | 156/628 |
| 4,288,470 | 9/1981 | Bate et al. | 427/88 |
| 4,337,476 | 6/1982 | Fraser et al. | 357/67 |

OTHER PUBLICATIONS

*IBM Technical Disclosure Bulletin*, vol. 25, No. 4 "Enhanced Polycide Structure" by D. R. Campbell, (9/82).
Article by Oppolzer et al. in J. Vac. Sci. Technol. B(1984) pp. 630-635.
Article by S. P. Murarka et al. in J. Appl. Phys. 51 (1980), pp. 1593-1598.
Article by S. P. Murarka entitled "Silicides for VLSI Applications", Academic Press 1983, p. 30.
Article by S. P. Murarka in J. Vac. Sci. Technol., 17, Jul./Aug. 1980, pp. 775-792.

*Primary Examiner*—Martin H. Edlow
*Assistant Examiner*—D. Featherstone
*Attorney, Agent, or Firm*—Hill, Van Santen, Steadman & Simpson

[57] ABSTRACT

Chemical reactions between a tantalum or tantalum silicide metallization layer and an underlying thin gate oxide are avoided by the interposition of an intermediate layer of oxygen-doped tantalum or tantalum silicide whose thickness amounts to about 1/20 to 1/5 of the layer thickness of the entire gate metallization. The metallization layer is produced by high-frequency sputtering in which oxygen is added at the beginning of the process and argon is used as a sputtering gas. Low specific resistance values are accomplished by means of this gate metallization.

5 Claims, 3 Drawing Figures 4,673,968

INTEGRATED MOS TRANSISTORS HAVING A GATE METALLIZATION COMPOSED OF TANTALUM OR NIOBIUM OR THEIR SILICIDES

BACKGROUND OF THE INVENTION

1. Field of the Invention

The present invention is in the field of circuit elements containing integrated MOS transistors and comprising a semiconductor substrate composed of silicon having an overlying gate oxide. The gate metallization applied over the gate oxide is composed in part of a metal or metal silicide of tantalum or niobium.

2. Description of the Prior Art

Doped, polycrystalline silicon is utilized as a standard material for gate contacting (gate metallization) in LSI (large scale integrated) MOS (metal oxide semiconductor) semiconductor technology. The principal reason for this is that with a thin gate oxide approximately 20 nm usually composed of $SiO_2$, the polysilicon has extremely stable and highly reproducible boundary surface properties. Among these are low mechanical stresses, low leakage currents, high punch-through voltage and defined work function. These properties, in turn, directly define the electrical behavior of the MOS transistor. The conductivity of the polysilicon layer is expressed by means of its surface resistance which represents the resistivity divided by the thickness. Since a specific electrical resistance at a minimum of 800 micro-ohms can be assumed for highly doped polysilicon, a surface resistance of 16 ohms is obtained for a layer that is 500 nm thick.

In VLSI (very large scale integrated) MOS technology, the size of the electrically active regions in the semiconductor substrate is reduced to dimensions of 1 micron or below so that, for example, the diameter of contact holes or the width of the interconnects is also in this size range. This, in turn, creates the possibility of increasing the number of sub-units, such as memory units, per component.

The result of this development is that the bulk resistance rises greatly with reduced cross section and increased length of the connecting lines of doped polysilicon. An increase in the RC time constants of the component is thereby produced, resulting in a decisive reduction of the switching speeds. For DRAM (dynamic random access memory) memory components having more than 256 kilobit memory units, this can mean an increase in the memory access time in comparison to components, (for example 64 kilobit DRAMs), which do not have such large scale integration.

In order to avoid such effects, for example, in dynamic memory components having more than 1 megabit memory capacity and in order to be able to meet the demands regarding packing density, a surface resistance of about 0.3 to 0.6 ohms with a maximum layer thickness of 500 nm must be met for the metallization layer in the gate level. Such low values of resistance can no longer be achieved even with extremely highly doped polysilicon. A new material is thus required which has a high electrical conductivity and which also does not deteriorate the property of the extremely thin gate oxide of $SiO_2$ even at high temperatures, for example, at 900° C. which are necessary in the manufacturing process. A further, very important requirement is that the material can be easily integrated into already existing manufacturing processes for semiconductor components without great expenditure.

The electrical resistance of the metallization layer in the gate level can be reduced by partially replacing the polycrystalline silicon by a disilicide layer of molybdenum, tungsten, tantalum or titanium as described, for example, in an article by S. P. Murarka in J.Vac.Sci.-Technol. 17 (1980), pages 775 to 792. The materials combination is based on the fact that the disilicides of the metals no longer react with silicon even at temperatures of 1000° C. In an atmosphere containing oxygen, this combination of materials forms an $SiO_2$ passivation layer on the disilicide. Since a thin polysilicon layer (about 200 nm) remains between the gate oxide and the disilicide, the favorable electrical properties and the long-term stability of the polysilicon-$SiO_2$ boundary layer are not adversely affected. Very high compatibility with the existing polysilicon gate process is achieved with this double layer of 200 nm polysilicon and 300 nm disilicide but the surface resistances achieved are at best 0.6 to 0.8 ohms even with the lowest impedance disilicide (the resistivity of titanium silicide is 25 micro-ohm cm).

Where a pure silicide metallization is used in which the disilicide is in direct contact with the gate oxide, then, due to the higher work function of the silicides in comparison to polysilicon, the resulting circuit would have additional advantages. Titanium silicide, however, would be the only disilicide with which the required surface resistance would be obtained at a thickness of 500 nm. As reported by S. P. Murarka in the book "Silicides for VLSI Applications", Academic Press, 1983, page 30, the specific values of resistance of co-sputtered tantalum disilicide is at about 50 micro-ohm cm, and that of co-sputtered tungsten disilicide being about 70 micro-ohm cm. The high reactivity of the titanium silicide at about 900° C., which is a common processing temperature, leads to a reaction with the $SiO_2$ whereby $TiO_2$ remains as the final product, and the gate oxide is thereby destroyed.

U.S. Pat. No. 4,337,476 discloses that a stable gate metallization is possible using an excess of silicon in the titanium disilicide or the tantalum disilicide. However, it is also known from an article by P. S. Murarka and D. B. Fraser in J. Appl. Phys., 51 (1980) pages 1593 to 1598, that these materials have an elevated specific electrical resistance in comparison to the disilicide of stoichiometric proportions.

The use of the pure metals molybdenum and tungsten provides difficulties insofar as these two metals do not form a passivation layer and volatile oxides can even arise in an atmosphere which contains oxygen. Additional manufacturing steps such, for example, as heating in a humid hydrogen atmosphere or covering the metal with oxides must therefore be used. An additional difficulty in the combination of molybdenum or tungsten with $SiO_2$, due to the low chemical affinity between the materials, is that the adhesion of these materials to the gate oxide is deficient. A solution to this might be achieved in using a thin (for example, 50 nm) intermediate layer of a silicon-rich tungsten disilicide or molybdenum disilicide or in utilizing a molybdenum-tungsten alloy with about 8 mol % tantalum as a layer between the $SiO_2$ gate and the pure molybdenum. For MOS production lines in which the combination of tantalum disilicide and polysilicon as gate metallization or tantalum disilicide containing 35 mol % tantalum as a diffusion barrier between silicon and aluminum have heretofore been employed, but the introduction of an additional material such as molybdenum or tungsten for a low impedance gate metallization represents a serious modification and a relatively great expenditure for apparatus. A corresponding gate material based upon tantalum which might be of great economic interest in these production lines is still unavailable.

SUMMARY OF THE INVENTION

The present invention provides an improvement in the aforementioned area by providing a gate metallization for an integrated circuit containing MOS transistors, the gate metallization exhibiting both a low surface resistance and a high work factor as well as stability toward high temperatures.

The present invention provides an improved gate metallization in an integrated MOS semiconductor circuit of the type described which contains an intermediate metal or metal silicide layer doped with oxygen in the direction of the gate, the thickness of this intermediate layer amounting to about 1/20 to 1/5 of the layer thickness of the entire gate metallization.

In the improved method of the present invention, a silicon substrate is coated preferably in a high frequency cathode sputtering system (also DC magnetron sputtering is possible) utilizing silicon and tantalum targets to produce tantalum and silicon levels in an oxygen-containing atmosphere, using argon as the sputtering gas. This sputtering is continued until the layer thickness of the tantalum or the tantalum silicide intermediate layer reaches a desired extent, after which the silicon target is shut off together with the oxygen feed. The sputtering is then continued with tantalum alone.

Typically, the thickness of the intermediate layer is between 1 and 10 nm. The volume ratio of argon to oxygen is normally set at a range of 5 to 30 to 1. In a preferred form of the invention, the method involves adjusting the ratio of tantalum to silicon in the deposition of the intermediate layer with respect to level thickness so that an oxygen-doped tantalum silicide having 35 mol % tantalum is produced.

In a typical procedure for the manufacture of an intermediate layer according to the present invention, an oxygen-doped tantalum silicide deposition is begun by depositing a tantalum layer about 1 nm thick, followed by a 2 nm thick silicon layer. This sequence is continued in an oxygen atmosphere until at least 20 double layers composed of tantalum/silicon have been deposited.

Following the gate metallization, the substrates may be subjected to a high temperature treatment of about 900° C. in an argon atmosphere for a period of time of about one hour.

BRIEF DESCRIPTION OF THE DRAWINGS

The invention shall be set forth more completely with reference to examples shown in FIGS. 1 through 3 of the drawing. In these Figures.

DESCRIPTION OF THE PREFERRED EMBODIMENTS

The qualitative destruction of the gate oxide ($SiO_2$) by tantalum can be described by the following equation:

$$2 Ta + 2.5 SiO_2 \rightarrow Ta_2O_5 + 2.5 Si$$

We have found that this reaction can be shifted to temperatures above 950° C. when the tantalum is previously doped with oxygen upon deposition onto the $SiO_2$ layer. It has been shown that the doping of tantalum or of a tantalum-silicon alloy layer containing 33 to 40 mol % tantalum with oxygen need only occur in a thin layer region, typically 5 to 100 nm, at the beginning of the coating. In the subsequent high temperature manufacturing steps which may take place at 900° C., only about 2 to 4 nm of the gate oxide are consumed. The boundary surface thereby exhibits only a very slight waviness of about 1 nm. The fact that a slight reaction between the oxygen-doped tantalum or tantalum silicide occurs confirms the good adhesion of the material on the gate oxide. The punch-through voltages are identical to those of the polysilicon gates.

In order to achieve the required resistance with the oxygen-doped tantalum silicide layer, the overall thickness of the alloy layer should only amount to about 80 nm. This is covered, for example, by a 400 nm thick tantalum layer which exhibits a specific electrical resistance of about 15 micro-ohm cm after a 900° C. heat treatment.

The oxygen concentration in the doped zone is chosen such that, after manufacture, the tantalum metal or the tantalum component in the tantalum silicide is present as an amorphous sub-oxide, for example, $TaO$. The oxygen concentration is accordingly set to 10 through 30 mol % in the doping zone.

In a subsequent heat treatment, for example, at 900° C. for one hour, the amorphous oxide crystallizes and an extremely thin zone containing $Ta_2O_5$ can be observed. In the case of a tantalum silicide intermediate layer, $SiO_2$ can also be produced. A significant criterion for the correct oxygen doping is that the higher work factor of tantalum or tantalum silicide in comparison with polysilicon is retained.

Figure 1:
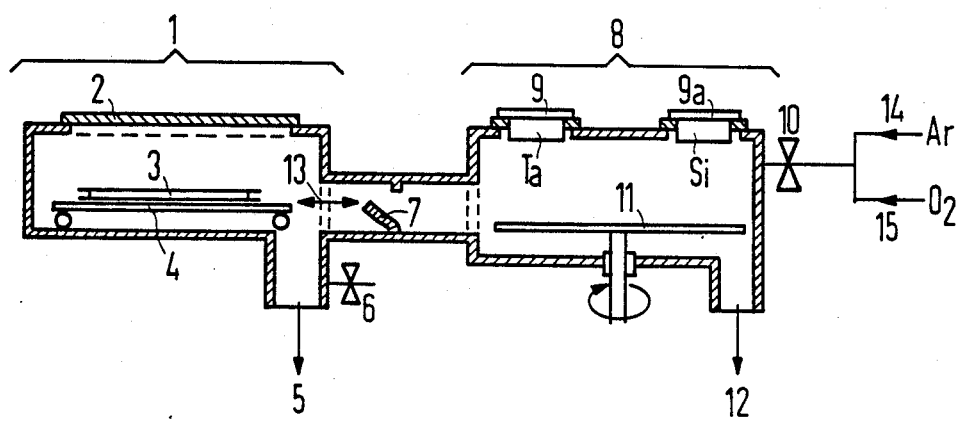
FIG. 1 is a schematic illustration of a structure of a system for co-sputtering comprising two targets which may be employed for the manufacture of the gate metallization.

In FIG. 1, there is shown a high vacuum chamber 1 over which there is lock cover 2. Located within the chamber 1 is a substrate pallet 3 on which the substrates (not shown) are loaded. A transport boat 4 delivers the pallet into a coating chamber 8 through an intermediate valve 7. The pallet 3 is conveyed into the coating chamber and returned to the high pressured lock as indicated by the double-ended arrow 13.

A high vacuum is drawn in the chamber 1 by means of a high vacuum pump (not shown), the vacuum being indicated by the reference arrow 5. The vacuum in the chamber is on the order of $10^{-6}$ mbar. The pressure conditions in the coating chamber 8 are substantially the same as those in the high vacuum lock 1. The connection to the high vacuum pump illustrated at reference numeral 5 also includes a vent valve 6 as illustrated.

The pallet 3 is conveyed into the coating chamber and deposited on a rotary plate 11 contained therein. The transport boat moves back into the high vacuum chamber 1 and the intermediate valve 7 is again closed.

The co-sputtering system shown in FIG. 1 makes possible the simultaneous atomization of pure silicon and pure tantalum. The co-sputtering system is so designed that the silicon substrates to be coated while on the rotary plate 11 are repeatedly conducted past the tantalum and silicon targets 9 and 9a such that a multilevel layer of tantalum and silicon is deposited. During deposition, the coating chamber 8 is kept at a suitably low vacuum by means of high vacuum pumps indicated at reference numeral 12.

Further details of the co-sputtering may be derived from the report by Oppolzer et al in J. Vac. Sci. Technol. B2 (4) 1984, pages 630 through 635. The thickness of the silicon and tantalum levels is extremely low (for example, 1 to 10 nm) so that a certain blending of the two metals occurs during manufacture. The composition of the tantalum-silicon layer structure is defined by the ratio of the thicknesses of the individual levels. In the case of a composition of 35 mol % tantalum, the layer thickness ratio of tantalum to silicon is about 1 to 2

During coating, the pallet 3 is rotated while on the rotary plate 11. Argon is introduced through an inlet line 14 and oxygen through an inlet line 15. The gas volumes introduced into the coating chamber 8 are under the control of an inlet valve 10.

After the substrates have been introduced into the coating chamber 8 from the high vacuum zone 1, a predetermined quantity of oxygen is admitted into the system through the inlet line 15. For example, the argon may constitute 0.5 volume units at normal pressure to which is added, for example, 14 volume units of oxygen. The absolute quantities of the gases, argon and oxygen, depend on various apparatus parameters such, for example, as target to substrate spacing, the flow conditions in the sputtering chamber, the power of the vacuum pumps, and the growth rate of the materials. The volume ratio of argon to oxygen is normally set in the range from 5 to 30 to 1.

When constant flow conditions have been established, the tantalum target 9 is ignited and the substrates begin to move past the tantalum target 9 at the same time. When all the substrates have been coated with about a 1 nm thick tantalum layer, the silicon target 9a is additionally ignited. The thickness of the silicon layers deposited per revolution is about 2 nm. After, for example, 26 tantalum-silicon double layers each having a thickness of 3 nm have been deposited, the oxygen feed is interrupted and the silicon deposition is also terminated. The growth rate for tantalum is now increased, for example, to 20 nm/layer in order to deposit the remaining 400 nm of tantalum as a cover layer as quickly as possible.

After a heat treatment of the substrates at, for example, 900° C. in argon for about one hour in a tubular clean system especially provided for this purpose, the resistance of the sputtered layer combination drops to its final value. The oxygen-doped, roughly 80 nm thick tantalum silicide layer now has a specific electrical resistance of about 150 micro-ohm cm, whereas the specific electrical resistance of the tantalum layer is about 15 micro-ohm cm. The specific resistance of 0.35 to 0.40 ohms/□ is thereby obtained for the tantalum silicide/tantalum gate metallization.

Figure 2:
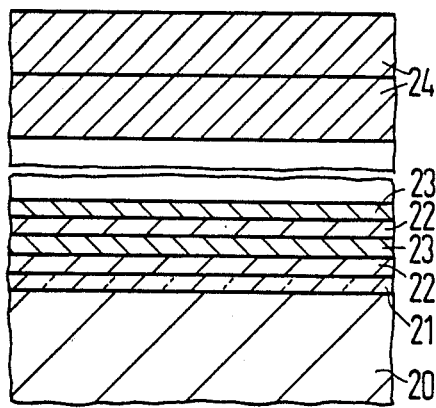
FIG. 2 is a cross-sectional view on a greatly enlarged scale of the layer structure of one arrangement produced in accordance with the method of the present invention.

FIG. 2 shows the level-by-level buildup of the layer sequence produced by the process illustrated in FIG. 1. The silicon substrate has been identified at reference numeral 20, and the gate oxide measuring about 20 nm is identified at reference numeral 21. The 1 nm thick tantalum levels doped with oxygen are referred to at reference numeral 22, while the 2 nm thick silicon levels doped with oxygen are referred to at 23. The 400 nm thick pure tantalum layer (without oxygen doping) is identified at reference numeral 24.

Figure 3:
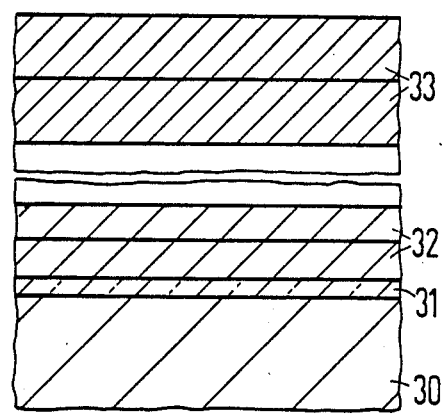
FIG. 3 is a cross-sectional view on a greatly enlarged scale of a second form of the present invention.

When only the tantalum target 9 is used to provide the gate metal, then a somewhat higher concentration of argon is selected for the oxygen doping. The volume ratio of argon/oxygen is in the range from about 2 to 20 to 1. In this case also, the oxygen doping is undertaken at the beginning of the doping. The thickness of the doped region typically lies between 5 and 100 nm. In FIG. 3, reference numeral 30 has been applied to the silicon substrate, and 31 to the 20 nm thick gate oxide of $SiO_2$. The 3 nm thick oxygen-doped tantalum levels have been identified at numeral 32 and numeral 33 refers to the 20 nm thick tantalum levels without oxygen doping. Minimum values of surface resistance of about 0.3 ohms/□ can be achieved with this type of metallization after heat treating at 900° C. in argon for one hour.

In contrast to the gate metallization disclosed in U.S. Pat. No. 4,337,476 a tantalum or tantalum silicide intermediate layer having a slight tantalum excess (35 mol % tantalum) can also be employed. In addition to the advantage that the same initial material can be used for the tantalum-silicon gate and the tantalum-silicon diffusion barrier in contacts, the material combination of the present invention has the advantage of lower specific electrical resistance, and higher work function in comparison to polysilicon or silicon-rich disilicides.

Due to the similarity of the elements niobium and tantalum, a low-impedance gate metallization can also be manufactured with an oxygen-doped niobium or niobium-silicon intermediate layer with a 400 nm thick pure niobium cover layer.

It should be evident that various modifications can be made to the described embodiments without departing from the scope of the present invention.

We claim as our invention:

1. An integrated MOS transistor comprising:
   a silicon substrate,
   a gate oxide layer overlying said substrate, and
   a gate metallization over said gate oxide layer including a tantalum or niobium metal or a tantalum or niobium silicide,
   said gate metallization including an intermediate layer of an oxygen doped metal or metal silicide layer having a thickness of from 1/20 to 1/5 of the overall thickness of the gate metallization.

2. An integrated MOS transistor according to claim 1 wherein the thickness of said intermediate layer is in the range from 5 to 100 nm.

3. An integrated MOS transistor according to claim 1 wherein said gate metallization includes an intermediate layer of oxygen-doped Ta silicide and a 400 to 500 nm thick tantalum 4. An integrated MOS circuit according to claim 1 wherein said intermediate layer is composed of an amorphous tantalum sub-oxide or tantalum silicide whose tantalum content is in the form of an amorphous sub-oxide.

5. An integrated MOS circuit according to claim 1 wherein said gate metallization is produced by high frequency cathode sputtering.

* * * * *